United States Patent
Hwang et al.

(10) Patent No.: US 12,126,200 B2
(45) Date of Patent: Oct. 22, 2024

(54) APPARATUS FOR CHARGING AND DISCHARGING BATTERY CELL

(71) Applicant: SK On Co., Ltd., Seoul (KR)

(72) Inventors: Chang Mook Hwang, Daejeon (KR); Gyeong Min Ryu, Daejeon (KR); Hyun Ji Kim, Daejeon (KR); Ha Neul Song, Daejeon (KR)

(73) Assignee: SK ON CO., LTD., Seoul (KR)

( * ) Notice: Subject to any disclaimer, the term of this patent is extended or adjusted under 35 U.S.C. 154(b) by 0 days.

(21) Appl. No.: 18/405,055

(22) Filed: Jan. 5, 2024

(65) Prior Publication Data
US 2024/0235225 A1    Jul. 11, 2024

(30) Foreign Application Priority Data

Jan. 6, 2023    (KR) .................. 10-2023-0002386

(51) Int. Cl.
*H01M 10/46* (2006.01)
*H02J 7/00* (2006.01)
*H05K 7/20* (2006.01)

(52) U.S. Cl.
CPC .......... *H02J 7/0044* (2013.01); *H02J 7/0013* (2013.01); *H02J 7/0047* (2013.01); *H05K 7/20909* (2013.01)

(58) Field of Classification Search
CPC ...... H02J 7/0047; H02J 7/0044; H02J 7/0042; H02J 7/0013; H02J 7/20909; H05K 7/20909
USPC .......................... 320/107, 114, 116, 150, 153
See application file for complete search history.

(56) References Cited

U.S. PATENT DOCUMENTS

| | | | |
|---|---|---|---|
| 9,573,217 B2* | 2/2017 | Burkhart | B23K 9/1081 |
| 2004/0175610 A1 | 9/2004 | Moores, Jr. et al. | |
| 2008/0026284 A1 | 1/2008 | Fujii | |
| 2012/0080941 A1 | 4/2012 | Scheucher | |

(Continued)

FOREIGN PATENT DOCUMENTS

| | | | |
|---|---|---|---|
| KR | 20090030545 A | 3/2009 | |
| KR | 101020587 B1 | 3/2011 | |

(Continued)

OTHER PUBLICATIONS

Extended European Search Report for the European Patent Application No. 24150593.2 issued by the European Patent Office on Jun. 4, 2024.

*Primary Examiner* — Edward Tso
(74) *Attorney, Agent, or Firm* — IP & T GROUP LLP

(57) ABSTRACT

The present disclosure relates to an apparatus for charging and discharging, comprising: a case; a first chamber and a second chamber positioned in the case along width direction of the case and configured to accommodate a first battery cell and a second battery cell respectively; a module chamber positioned inside the case and outside the first chamber and the second chamber; a charging/discharging module portion positioned in the module chamber and charging and discharging the first battery cell and the second battery cell; a module hole formed through one face of the case to communicate the module chamber with the outside of the case; and an air treatment portion provided inside the case to supply air to the module chamber at a temperature lower than an external temperature, which is a temperature outside the case.

20 Claims, 6 Drawing Sheets

(56) References Cited

U.S. PATENT DOCUMENTS

| | | |
|---|---|---|
| 2014/0287281 A1 | 9/2014 | Murata et al. |
| 2015/0010802 A1 | 1/2015 | Inoue |
| 2020/0052355 A1* | 2/2020 | Kosteva .................. B60L 50/64 |

FOREIGN PATENT DOCUMENTS

| | | |
|---|---|---|
| KR | 101262974 B1 | 5/2013 |
| KR | 101488054 B1 | 1/2015 |
| KR | 101870997 B1 | 6/2018 |
| KR | 20190012058 A | 2/2019 |
| KR | 10-2022-0051758 A | 4/2022 |
| KR | 10-2022-0161757 A | 12/2022 |

* cited by examiner

APPARATUS FOR CHARGING AND DISCHARGING BATTERY CELL

CROSS-REFERENCE TO RELATED PATENT APPLICATION

The present application claims priority under 35 U.S.C. § 119(a) to Korean patent application number 10-2023-0002386 filed on Jan. 6, 2023, in the Korean Intellectual Property Office, the entire disclosure of which is incorporated by reference herein.

BACKGROUND OF THE INVENTION

1. Field

The present disclosure relates to an apparatus for charging and discharging applied to an assembly process of one of secondary battery or battery cell. More specifically, it relates to an apparatus for charging and discharging in which a chamber and a charging and discharging module for charging and discharging a battery cell are both integrated into one.

2. Description of the Related Art

A secondary battery needs to go through a charging and discharging process during the manufacturing process. Electrical characteristics can be imparted to a secondary battery by forming a solid electrolyte interphase (SEI) layer on an anode of a secondary battery through a charging/discharging process or an activation process.

Generally, an apparatus for charging and discharging for a charging/discharging process is manufactured with a structure capable of implementing the function of simultaneously charging and discharging a plurality of battery cells to improve the productivity of secondary batteries.

In a conventional apparatus for charging and discharging, a chamber accommodating battery cells is arranged along the height direction. In addition, in a conventional apparatus for charging and discharging, air circulation for a chamber occurs only inside the apparatus for charging and discharging.

When the external temperature at a position at which an apparatus for charging and discharging is installed is higher than the temperature at which the apparatus for charging and discharging normally operates, the operation of the apparatus for charging and discharging may be affected by the external temperature. Separate air-conditioning equipment may be required to solve the above problem, but installation of air-conditioning equipment may be difficult depending on the position. Therefore, in order to lower the external temperature, there is a need to control the external temperature of an apparatus for charging and discharging by discharging a portion of the air circulating inside an apparatus for charging and discharging to the outside.

In addition, considering production facilities of secondary batteries, a conventional apparatus for charging and discharging includes a plurality of chambers. When the arrangement of the wires electrically connecting battery cells accommodated in a plurality of chambers to charging/discharging modules is complex, the resulting heat loss may not be ignored. Therefore, in consideration of heat loss, it is necessary to simplify the wires (or busbars) of the charging/discharging channels connecting charge/discharge modules to each battery cell.

SUMMARY OF THE INVENTION

First, according one aspect of the present disclosure, a problem that the present disclosure aims to solve is to integrate both a charging/discharging module and a charging/discharging chamber for a charging/discharging process in a manufacturing process of battery cells.

Second, according another aspect of the present disclosure, a problem that the present disclosure aims to solve is to simplify an electrical connection line between the charge/discharge module and the battery cells accommodated inside a charge/discharge chamber by symmetrically arranging the charge/discharge chamber.

Third, according still another aspect of the present disclosure, a problem that the present disclosure aims to solve is to include an air treatment portion capable of controlling the temperature of a charging/discharging module inside a case.

Fourth, according yet another aspect of the present disclosure, a problem that the present disclosure aims to solve is to discharge a part of cooled air supplied from the air treatment portion to the outside in order to prevent the external temperature of an apparatus for charging and discharging from increasing.

Meanwhile, battery cells manufactured by an apparatus for charging and discharging according to the present disclosure can be widely applied in the field of green technology, such as electric vehicles, battery charging stations, energy storage systems (ESS), solar power generation (photovoltaics), and wind power generation using batteries. In addition, battery cells manufactured by an apparatus for charging and discharging according to the present disclosure can be used in eco-friendly mobility including electric vehicles and hybrid vehicles to prevent climate change by suppressing air pollution and greenhouse gas emissions.

To solve the above-described problem, an apparatus for charging and discharging according to the present disclosure may include: a case including a first inlet and a second inlet in front; a first chamber positioned inside the case and accommodating a first battery cell through the first inlet; a second chamber positioned inside the case, spaced apart from one side of the first chamber along the width direction of the case, and accommodating a second battery cell through the second inlet; a module chamber positioned inside the case and outside the first chamber and the second chamber; a charging/discharging module portion positioned in the module chamber and charging and discharging the first battery cell and the second battery cell; a module hole formed through one face of the case to communicate the module chamber with the outside of the case; and an air treatment portion provided inside the case to supply air to the module chamber at a temperature lower than an external temperature, which is a temperature outside the case.

The flow rate of air supplied to the module chamber through the air treatment portion may be greater than the flow rate of air discharged through the module hole.

The apparatus for charging and discharging may further include: a module cover opening and closing the module hole; an opening/closing actuation portion opening and closing the module cover; and a control portion controlling the charging/discharging module portion, the air treatment portion, and the opening/closing actuation portion, wherein the control portions operates the module cover through the opening/closing actuation portion to open the module hole when the external temperature is higher than a preset allowable external temperature.

The apparatus for charging and discharging may further include a temperature sensor sensing the external temperature.

Meanwhile, the apparatus for charging and discharging may further include: based on the width direction of the case, a module first side face forming one side face of the module chamber, which is a part of a case first side face, which is one side face among both side faces of the case; a module second side face forming the other side face of the module chamber, which is a part of a case second side face, which is the other side face of the case; and a module fan positioned closer to the module second side face than to the module first side face inside the module chamber and moving air at a temperature lower than the external temperature to the charging/discharging module portion, wherein the module hole may be positioned at the module first side face of the module chamber or closer to the module first side face than to the module second side face.

The module hole may be positioned closer to an upper part of the module chamber than to a lower part of the module chamber in the module chamber.

The module fan may be obliquely provided so that air at a temperature lower than the external temperature moves toward an upper part of the module chamber.

The air treatment portion may be provided inside the case and include a heat exchanger exchanging heat with air inside the case.

In addition, the apparatus for charging and discharging may further include: a module fan rotating to direct air passing through the heat exchanger toward the charging/discharging module portion.

In addition, the apparatus for charging and discharging may further include: a case upper face forming an upper face of the case; and a module upper face forming an upper face of the module chamber, which is a part of the case upper face, wherein on the module upper face, at least a part of the module upper face may be recessed in a direction away from the charging/discharging module portion along the height direction of the case to form a module auxiliary chamber.

Meanwhile, the apparatus for charging and discharging may further include: a case upper face forming an upper face of the case; and a module upper face forming an upper face of the module chamber, which is a part of the case upper face, wherein the module upper face may be obliquely provided along the width direction of the case.

The apparatus for charging and discharging may further include: based on the width direction of the case, a module first side face forming one side face of the module chamber, which is a part of a case first side face, which is one side face among both side faces of the case; and a module second side face forming the other side face of the module chamber, which is a part of a case second side face, which is the other side face of the case, wherein the height of the module first side face may be lower than the height of the module second side face.

The apparatus for charging and discharging may further include a module fan positioned closer to the module first side face than to the module second side face inside the module chamber and moving air at a temperature lower than the external temperature to the charging/discharging module portion.

The module hole may be positioned at the module first side face of the module chamber or closer to the module first side face than to the module second side face.

At least a part of the module chamber may be positioned behind the first chamber and the second chamber based on the front-to-back direction of the case.

The module chamber may be positioned close to one side face of both side faces of the case along the width direction of the case and extend along the height direction of the case.

Meanwhile, the module chamber may be positioned between the first chamber and the second chamber based on the width direction of the case and extend along the height direction of the case.

The charging/discharging module portion may include a plurality of charging/discharging channels stacked along the height direction of the case.

The apparatus for charging and discharging may further include: a case upper face, which is an upper face of the case; a module chamber upper face forming an upper face of the module chamber, which is a part of the case upper face; and a module hole included in the module chamber upper face.

In addition, the apparatus for charging and discharging may further include: based on the width direction of the case, a case first side face forming one side face of both sides of the case; and a second side face forming the other side face of the case, wherein the first chamber is positioned closer to the case first side face than to the case second side face, and the second chamber is positioned closer to the case second side face than to the case first side face.

First, an apparatus for charging and discharging according to one embodiment of the present disclosure can integrate a converter that converts alternating current into direct current and an inverter that converts direct current into alternating current, and can control all of a plurality of charging/discharging modules at one control portion.

Second, an apparatus for charging and discharging according to another embodiment of the present disclosure can simplify electrical connection wires between charging/discharging modules and battery cells accommodated inside charging and discharging chambers, thereby minimizing thermal inefficiency occurring at wires.

Third, an apparatus for charging and discharging according to still another embodiment of the present disclosure is provided with an air treatment portion capable of controlling temperature of charging/discharging modules inside the apparatus for charging and discharging, so it is not necessary to consider a position for installing a separate condenser and a compressor outside.

Fourth, an apparatus for charging and discharging according to yet another embodiment of the present disclosure can maintain environmental conditions of a place where the apparatus for charging and discharging is installed by discharging a part of cooled air supplied from an air treatment portion to the outside.

DETAILED DESCRIPTION

Figure 1:
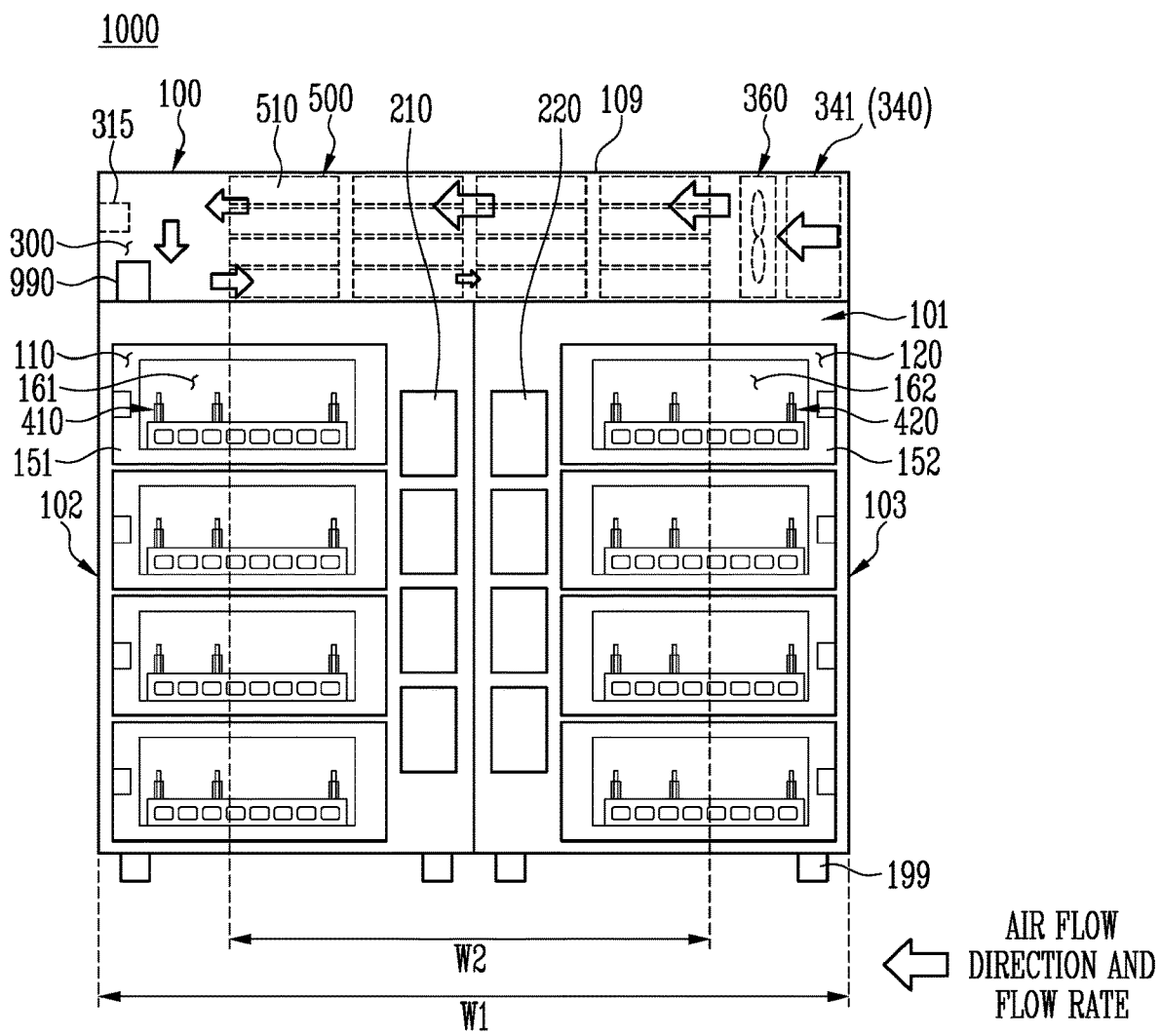
FIG. 1 shows an example of an apparatus for charging and discharging according to the present disclosure.

Hereinafter, preferred embodiments of the present disclosure will be described in detail with reference to the attached drawings. The configuration or control method of the device described below is only for explaining the embodiments of the present disclosure and is not intended to limit the scope of the present disclosure, and the same reference numerals used throughout the specification indicate the same components.

A battery cell described in the present specification may include a cathode, an anode, a separator, and an electrolyte. The battery cells may be classified into pouch type, prismatic type, and cylindrical type according to the shape of a case, but an apparatus for charging and discharging according to the present disclosure is applicable to any type of battery cells.

FIG. 1 shows an example of an apparatus for charging and discharging 1000 according to the present disclosure.

Referring to FIG. 1, the apparatus for charging and discharging 1000 may include: a case 100 including a first inlet 110 and a second inlet 120 in front; a first chamber 161 positioned inside the case 100 and accommodating a first battery cell through the first inlet 110; a second chamber 162 positioned inside the case 100, spaced apart from one side of the first chamber 161 along the width direction of the case 100, and accommodating a second battery cell through the second inlet 120; a module chamber 300 positioned inside the case 100 and outside the first chamber 161 and the second chamber 162; a charging/discharging module portion 500 positioned in the module chamber 300 and charging and discharging the first battery cell and the second battery cell; a module hole 325 formed through one face of the case 100 to communicate the module chamber 300 with the outside of the case 100; and an air treatment portion 340 provided inside the case 100 to supply air to the module chamber 300 at a temperature lower than an external temperature, which is a temperature outside the case 100.

Unlike a conventional apparatus for charging and discharging, in the apparatus for charging and discharging 1000, a first chamber 161 and a second chamber 162 accommodating a plurality of battery cells (not shown) for charging and discharging, and a charging/discharging module portion 500 supplying electrical energy for charging/discharging the plurality of battery cells accommodated in the first chamber 161 and the second chamber 162 may be installed in a single case 100.

The case 100 may be provided to form an external shape of the apparatus for charging and discharging 1000 and to protect items accommodated therein. The case may have an approximately hexahedral shape. To this end, the case 100 may include: a case front face 101 forming a front face of the case; a case first side face 102 and a case second side face 103 forming both side faces of the case 100 along the width direction of the case 100, and a case upper face 109 forming an upper face of the case 100.

The case front face 101 may include a first inlet 110 and a second inlet 120. The first inlet 110 and the second inlet 120 may be arranged side by side along the width direction of the case 100. That is, along the width direction of the case 100, the second inlet 120 may be positioned spaced apart from one side of the first inlet 110.

The first chamber 161 and the second chamber 162 may accommodate one or more battery cells (not shown) through the first inlet 110 and the second inlet 120, respectively.

The apparatus for charging and discharging 1000 may be movably coupled with the case 100 and include a first door 151 and a second door 152 opening and closing the first inlet 110 and the second inlet 120, respectively.

Just as the first inlet 110 and the second inlet 120 are positioned at the same height based on the height direction of the case 100 and are arranged in the width direction of the case 100, the first door 151 and the second door 152 may also be positioned at the same height based on the height direction of the case 100. That is, the first chamber 161 and the second chamber 162 may be located at the same height, which is to locate the first chamber 161 and the second chamber 162 to be symmetrical based on an imaginary vertical line parallel to the height direction of the case 100. This is to simplify wire connection with a charging/discharging module portion 500, which will be described later.

The first chamber 161 and the second chamber 162 may accommodate a plurality of battery cells therein through the first inlet 110 and the second inlet 120, respectively. The first chamber 161 and the second chamber 162 may be maintained by setting the temperature and/or humidity therein to a preset chamber temperature and/or a preset chamber humidity. This is to charge and discharge battery cells accommodated in the first chamber 161 and the second chamber 162 for a preset charging/discharging time in an environment in which the chamber temperature and/or the chamber humidity are maintained.

The chamber temperature, the chamber humidity, and the charging/discharging time may be different for each chamber 161, 162.

The apparatus for charging and discharging 1000 may include: a first jig 410 that may be inserted to and withdrawn from the inside of the first chamber 161; and a second jig 420 that may be inserted to and withdrawn from the inside of the second chamber 162.

A first battery cell (not shown) accommodated in the first chamber 161 may be seated on the first jig 410. The first jig 410 may be electrically connected to a charging/discharging module portion 500, which will be described later. Likewise, a second battery cell (not shown) accommodated in the second chamber 162 may be seated on the second jig 420. In addition, the second jig 420 may be electrically connected to a charging/discharging module portion 500, which will be described later.

In the present specification, the first battery cell and the second battery cell may have different shapes. For example, when the first battery cell is a pouch-type battery cell, the second battery cell may be a prismatic-type battery cell.

The apparatus for charging and discharging 1000 may further include a supporting portion 199 for supporting the case 100 on the ground. The supporting portion 199 is a type of leg that may support the case 100 on the ground by spacing the case 100 apart from the ground. This is to easily adjust the horizontal and vertical alignment of the case 100.

The apparatus for charging and discharging 1000 includes a module chamber 300, which is a space separated from the first chamber 161 and the second chamber 162 inside the case 100.

The module chamber 300 is a space distinguished from the first chamber 161 and the second chamber 162, and may not be limited by a special compartment portion or partition wall to form the module chamber 300. Alternatively, the module chamber 300 may be a space that is formed to be clearly distinguished by a compartment portion or partition wall inside the case 100.

The module chamber 300 may accommodate a charging/discharging module portion 500 for charging and discharging a first battery cell and a second battery cell accommodated in the first chamber 161 and the second chamber 162, respectively.

Referring to FIG. 1, the first chamber 161 and the second chamber 162 are provided in a plural number, and each one of the plurality of first chambers 161 and each one of the plurality of second chambers 162 may form a pair, and then arranged along the height direction of the case 100.

The apparatus for charging and discharging 1000 may include: a first input/output portion 210 which is positioned on the case front face 101 and which outputs temperature and humidity of the first chamber 161 and charging/discharging status of a first battery cell and senses a user's input; and a second input/output portion 220 which outputs temperature and humidity of the second chamber 162 and charging/discharging status of a second battery cell and senses a user's input.

The first chamber 161 and the second chamber 162; the first door 151 and the second door 152, the first inlet 110 and the second inlet 120; the first inlet 110 and the second inlet 120; and the first input/output portion 210 and the second input/output portion 220 may be positioned symmetrically based on an imaginary vertical line extending in the height direction of the case 100.

That is, an imaginary vertical line passing through a half point of the length W1 between the case first side face 102 and the case second side face 103 will coincide with an imaginary vertical line passing through a half point of the length W2 of the charging/discharging module portion 500. Through this symmetrical arrangement, an apparatus for charging and discharging 1000 according to the present disclosure may simplify arrangement of busbars or wires electrically connecting the charging/discharging module portion 500 to the first jig 410 and the second jig 420.

Meanwhile, due to the heat generated when the charging/discharging module portion 500 is operated, the temperature of the module chamber 300 or the temperature inside the case 100 may increase. To maintain the temperature of the module chamber 300 or the temperature inside the case 100 at a preset management temperature, the apparatus for charging and discharging 1000 may include an air treatment portion 340 (see FIG. 2A) supplying air at a temperature lower than an external temperature, which is an external temperature outside the case 100, toward the charging/discharging module portion 500.

To forcibly move air passing through the air treatment portion 340 toward charging/discharging module portion 500, the apparatus for charging and discharging 1000 may further include a module fan 360. From a viewpoint of air flow, it will be preferable that the module fan 360 is positioned before passing the charging/discharging module portion 500.

Meanwhile, as described above, an external temperature of the case 100 or the apparatus for charging and discharging 1000 may also affect the operation of the apparatus for charging and discharging 1000. To this end, a separate air-conditioning apparatus may be provided to lower an external temperature of the apparatus for charging and discharging 1000. However, the apparatus for charging and discharging 1000 according to the present disclosure may discharge air at a temperature lower than the external temperature toward the outside of the apparatus for charging and discharging 1000 using the air treatment portion 340.

To this end, the apparatus for charging and discharging 1000 may further include a module hole 325 penetrating one face of the case 100 to fluidly communicate the module chamber 300 with the outside.

The module hole 325 will play a role of a passage for discharging at least a part of air passing through the charging/discharging module portion 500 to the outside. Therefore, preferably, the module fan 360 and the module hole 325 may be positioned in an opposite direction from each other with the charging/discharging module portion 500 interposed therebetween.

For example, referring to FIG. 1, the module hole 325 may be positioned between the case first side face 102 and the charging/discharging module portion 500, and the module fan 360 may be positioned between the case second side face 103 and the charging/discharging module portion 500.

Meanwhile, the apparatus for charging and discharging 1000 may further include a temperature sensor 990 for sensing the external temperature. Referring to FIG. 1, the temperature sensor 990 may be provided on the case front face 101, but this is only an example and it may be positioned anywhere else.

Figure 2A:
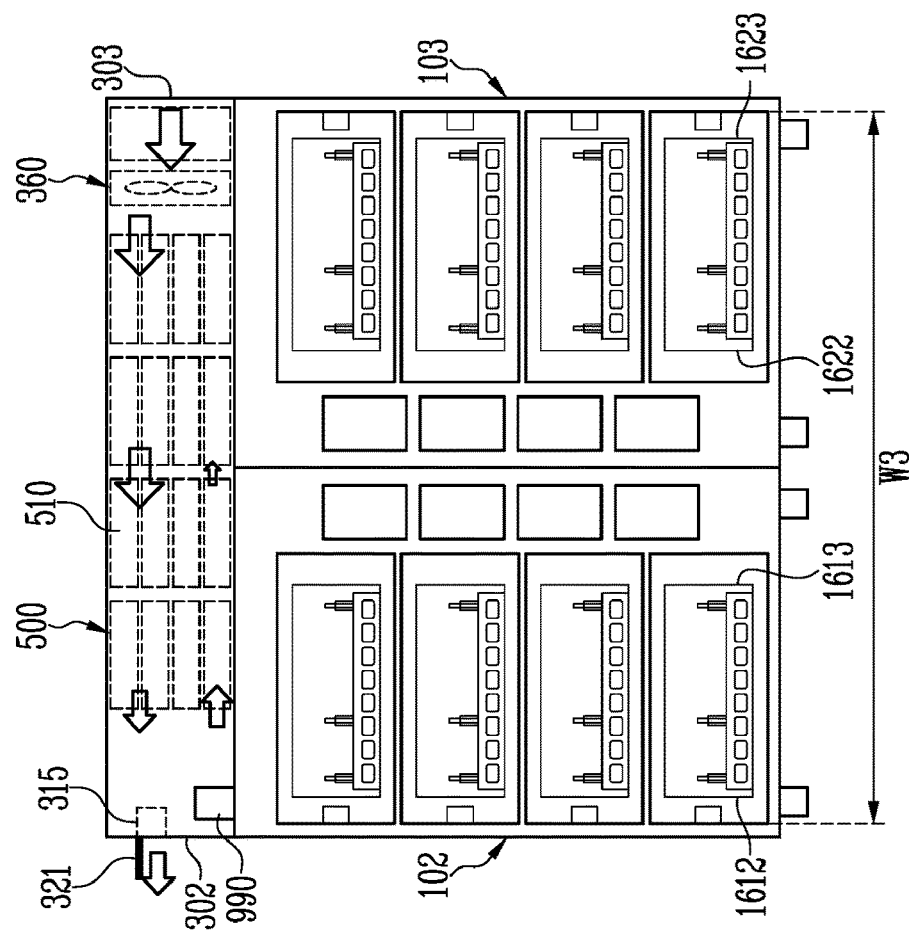
FIG. 2A shows an example of a side face of the apparatus for charging and discharging.
Figure 2B:
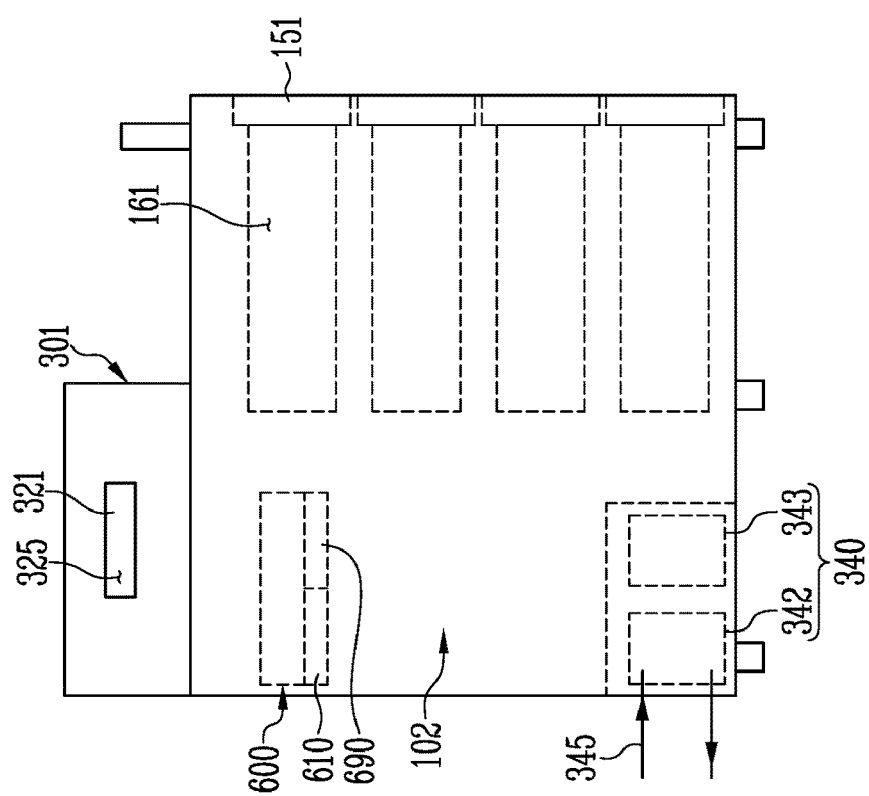
FIG. 2B shows an example in which a module hole is opened.

FIG. 2A shows an example of a side face of the apparatus for charging and discharging 1000; and FIG. 2B shows an example in which a module hole 325 is opened.

Referring to FIG. 2A, the module chamber 300 (see FIG. 1) may be positioned behind the first chamber 161 and the second chamber 162. That is, the module chamber 300 may be positioned closer to the rear (not shown) of the case 100 than to the case front face 101 (see FIG. 1). This is to prevent the apparatus for charging and discharging 1000 from falling forward due to the weight of the charging/discharging module portion 500 accommodated in the module chamber 300.

The module chamber 300 may be positioned on an upper side of the case 100 inside the case 100. However, unlike this, the module chamber 300 may be formed as a separate chamber and formed outside the case 100. Unless otherwise specified, the present specification has been described based on the module chamber 300 being positioned inside the case 100.

Referring to FIGS. 2A and 2B, the case first side face 102 may include, based on the width direction of the case 100, a module first side face 302, which is one side face of the module chamber 300. Likewise, the case second side face 103 may include a module second side face 303, which is the other side face of the module chamber 300.

That is, at least a part of the case first side face 102 will be formed by the module first side face 302, and at least a part of the case second side face 103 may be formed by the module second side face 303.

In addition, referring to FIG. 2B, a module upper face 309 forming an upper face of the module chamber 300 may form at least a part of the case upper face 109. Likewise, a module front face 301 (see FIG. 3) forming a front face of the module chamber 300 may form a part of the case front face 101.

Referring to FIG. 2A, the case upper face 109 may be formed to be stepped so that the height of the rear of the case upper face 109 is higher than the front.

Since the case 100 may fall forward when the module chamber 300 is arranged closer to the front of the case 100 than to the rear, to prevent this, the module chamber 300 may be positioned closer to the rear of the case 100 than to the front.

The module hole 325 may be positioned on the case first side face 102. Specifically, it will be preferable that the module hole 325 is positioned on the module first side face 302. This is because the flow of air passing through the charging/discharging module portion 500 may become weak and the temperature may rise. That is, discharging air through the module hole 325 before passing through the charging/discharging module portion 500 is more effective in lowering the external temperature of the apparatus for charging and discharging 1000.

When all the air passing through the charging/discharging module portion 500 is discharged through the module hole 325, it will be difficult to maintain the internal temperature of the case 100 or the temperature of the module chamber 300 within an allowable range through the air treatment portion 340.

Therefore, the flow rate of air supplied to the module chamber 300 through the air treatment portion 340 will be greater than the flow rate of air discharged through the module hole 325. That is, only a part of the air passing through the air treatment portion 340 is discharged through the module hole 325, and the other part of the air may change the flow direction inside the case 100 and circulate inside the case 100 through the air treatment portion 340.

Referring to FIG. 2A, the air treatment portion 340 may operate in the same principle as a general air-conditioning apparatus. The air treatment portion 340 may include: a first heat exchanger 341 (evaporator, see FIG. 1) and a second heat exchanger 342 (condenser) for heat exchange between the surrounding air and a coolant; and a compressor 343 compressing the coolant to circulate the same. In addition, the air treatment portion 340 may further include an expansion portion (not shown) expanding the coolant passing through a condenser 342. In the present specification, unless particularly mentioned, a heat exchanger refers to a first heat exchanger.

Since the condenser 342 releases heat to the surrounding air and the compressor 343 releases heat upon compression of the coolant, the condenser and the compressor may be positioned outside the case 100. However, in this case, a separate space may be required for the condenser 342 and the compressor 343.

Therefore, in the present disclosure, a water-cooling method for cooling the condenser 342 with external water may be utilized instead of locating the condenser 342 inside the case 100. To this end, the apparatus for charging and discharging 1000 may further include a circulation pipe 345 receiving water from the outside and circulating the same for heat exchange with the condenser 342.

The circulation pipe 345 may also be provided to exchange heat with the compressor 343.

Meanwhile, the apparatus for charging and discharging 1000 may further include a control portion 600 for controlling the charging/discharging module portion 500, the temperature sensor 990, the air treatment portion 340, the module fan 360, the first input/output portion 210, and the second input/output portion 220. The control portion 600 may be positioned anywhere inside the case 100 as long as it is capable of controlling the charging/discharging module portion 500, the temperature sensor 990, the air treatment portion 340, the module fan 360, the first input/output portion 210, and the second input/output portion 220.

The apparatus for charging and discharging 1000 may include a power supply portion (not shown) electrically connected to the outside to be supplied with power required for the apparatus for charging and discharging 1000.

The electrical energy received through the power supply portion may be used to charge and discharge battery cells accommodated in the first chamber 161 and the second chamber 162 and to operate other necessary components, for example, a control portion 600 and an air processing portion.

The form of electricity supplied to the power supply portion may be alternating current. Therefore, the control portion 600 may include an inverter 610 converting alternating current into direct current in order to obtain the direct current required by the charging/discharging module portion 500 when charging battery cells. In addition, the control portion 600 may further include an AC-DC converter 690 converting direct current to alternating current when the battery cells are discharged. The apparatus for charging and discharging 1000 can be used by regenerating electricity emitted during discharging through the converter without discarding it.

In addition, the control portion 600 may further include a DC-DC converter (not shown) for converting the electricity that has been converted into direct current through the inverter 610 into direct current having a predetermined voltage and current (e.g., 5 V (volt) and 200 A (ampere)) during the charging of the battery cells.

Referring to FIG. 2B, the charging/discharging module portion 500 may include a plurality of charging/discharging channels 510. The plurality of charging/discharging channels 510 may be electrically connected to each jig to charge or discharge battery cells mounted on each of the jigs.

The charging/discharging channel 510 may include a current wire (not shown) consisting of a cable or busbar to be electrically connected to battery cells.

It is preferable that a busbar for electrically connecting the charging/discharging channel 510 and jigs corresponding to the charging/discharging channel 510 is arranged at the shortest possible distance. This is because the longer the length of the bus bar, the greater the loss due to heat generation.

For charging of battery cells accommodated in the apparatus for charging and discharging 1000, the control portion 600 will supply the electricity in the form of alternating current to the charging/discharging channel 510 through the inverter and the DC-DC converter to charge the battery cells. In addition, the control portion 600 may monitor the voltage of the battery cells being charged.

Meanwhile, the apparatus for charging and discharging 1000 may include one integrated inverter 610 for the plurality of charging/discharging channels 510. Likewise, the apparatus for charging and discharging 1000 may include one AC-DC converter 690 for the plurality of charging/discharging channels 510.

Since the integrated inverter 610 and the integrated AC-DC converter 690 generate relatively less heat than when they are provided in a plural number, loss due to heat can be minimized.

On the other hand, a plurality of DC-DC converters may be provided depending on the number of charging/discharging channels 510, because charging/discharging conditions for battery cells accommodated in each chamber may differ.

For example, when it is assumed that two battery cells are accommodated in the first chamber 161 and two battery cells are accommodated in the second chamber 162, the apparatus for charging and discharging 1000 may include two first jigs 410 inside the first chamber 161 and two second jigs 420 inside the second chamber 162. In addition, the apparatus for charging and discharging 1000 may require a total of four charging/discharging channels 510 for four battery cells. One charging/discharging channel 510 may be connected one-to-one to one battery cell or one jig. However, this is only an example described in the present disclosure, and the number and arrangement method may be modified in various ways.

The charging/discharging module portion 500 may include a charging/discharging module that is a collection of one or more charging/discharging channels 510. For example, referring to FIG. 2B, four charging/discharging channels that are stacked may be considered as one charging/discharging module.

In addition, the charging/discharging module portion 500 may include one or more charging/discharging modules.

For example, referring to FIG. 2B, the apparatus for charging and discharging 1000 includes four pairs of first chambers 161 and second chambers 162, each pair of a first chamber 161 and a second chamber 162 being stacked in the height direction of the case 100. Therefore, when two battery cells are placed in each chamber and four charging/discharging channels 510 for a pair of a first chamber 161 and a second chamber 162 and the four charging/discharging channels 510 are considered as one charging/discharging module, the charging/discharging module portion 500 may include may include four charging/discharging modules. However, this is only one example described in the present disclosure, and the number and arrangement method may be varied in various ways.

Meanwhile, the first chamber 161 may include: based on the width direction of the case 100, a first chamber first side face 1612 positioned closer to the case first side face 102 than to the case second side face 103 among both side faces of the first chamber 161; and a first chamber second side face 1613 positioned closer to the case second side face 103 than to the case first side face 102. In addition, the second chamber 162 may include: based on the width direction of the case 100, a second chamber first side face 1622 positioned closer to the case first side face 102 than to the case second side face 103 among both side faces of the second chamber 162; and a second chamber second side face 1623 positioned closer to the case second side face 103 than to the case first side face 102.

To simplify the length of the busbar provided between the charging/discharging module portion 500 and the first chamber 161 and the second chamber 162, an imaginary vertical line passing through a half point of the length W2 (see FIG. 1) of both ends of the charging/discharging module portion 500 along the width direction of the case 100 will coincide with an imaginary vertical line passing through a half point of the length W3 of the first chamber first side face 1612 and the second chamber second side face 1623.

Meanwhile, referring to FIG. 2B, a first heat exchanger 341 cooling the air passing through the first heat exchanger to cool the charging/discharging module portion 500 may be positioned inside the module chamber 300. The first heat exchanger 341 may be positioned between the module fan 360 and the module second side face 303. However, this is only an example, and when air at a temperature lower than room temperature may be moved toward the charging/discharging module portion 500 through the module fan 360, the first heat exchanger 341 may be positioned elsewhere.

When the external temperature is higher than a preset allowable external temperature, the control portion 600 may discharge a part of the air cooled by the air treatment portion 340 to the outside through the module hole 325.

To this end, the apparatus for charging and discharging 1000 may further include: a module cover 321 opening and closing the module hole 325; and an opening and closing actuation portion 315 opening and closing the module cover 321.

When the external temperature reaches a preset allowable external temperature, the control portion 600 may control the opening/closing actuation portion 315 to open the module cover 321. Through this, at least a part of the air passing through the charging/discharging module portion 500 will be discharged to the outside through the module hole 325.

To measure the external temperature, the apparatus for charging and discharging 1000 may further include a temperature sensor 990 positioned outside the case to sense the external temperature of the case. Therefore, the control portion 600 may determine the external temperature through the temperature sensor 990. That is, the control portion 600 can selectively open the module hole 325 according to the need.

Meanwhile, the module hole 325 may be positioned closer to an upper part of the module chamber 300 than to a lower part of the module chamber 300 in the module chamber. This is because the charging/discharging module portion 500 disrupts a flow of air passing through the module fan 360, so the air flow passing through the charging/discharging module portion 500 may naturally flow toward an upper portion of the module chamber 300.

Figure 3:
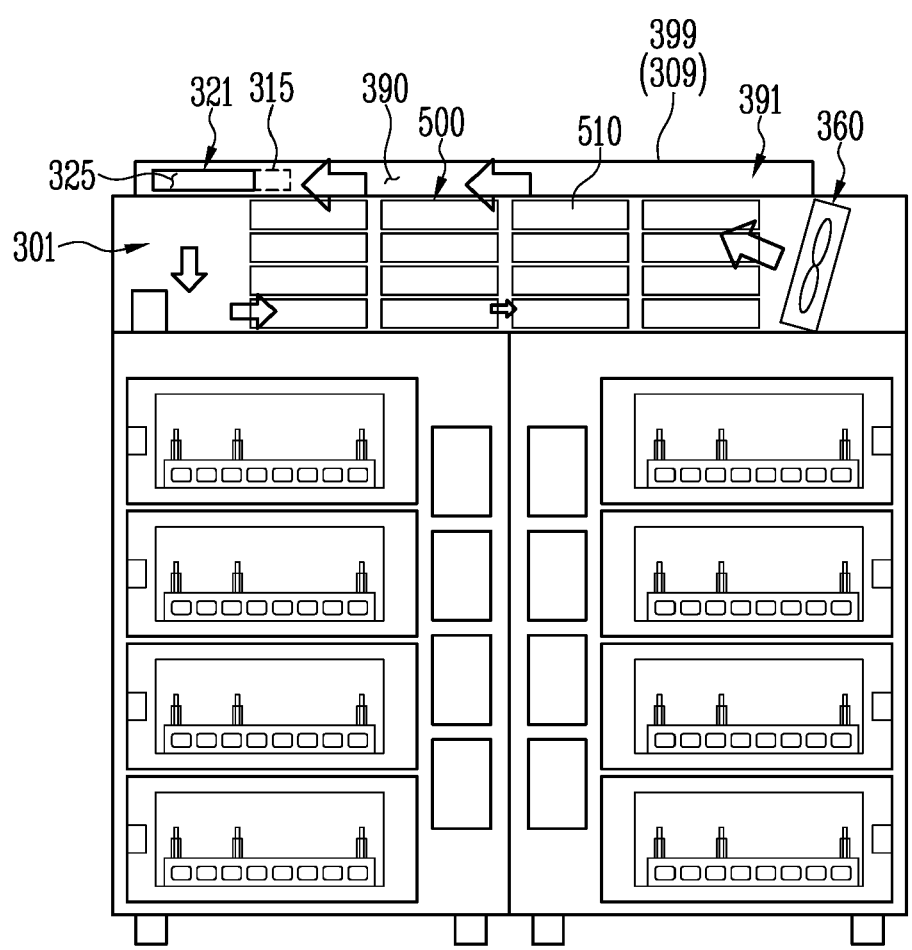
FIG. 3 shows another example of an apparatus for charging and discharging according to the present disclosure.

FIG. 3 shows another example of an apparatus for charging and discharging 1000 according to the present disclosure. The apparatus for charging and discharging 1000 may include: a case upper face 109 forming an upper face of the case 100; and a module upper face 309 forming an upper face of the module chamber 300, which is part of the case upper face 109, wherein the module upper face 309 may form a module auxiliary chamber 390 as at least a part of the module upper face 309 is recessed in a direction away from the charging/discharging module portion 500 along the height direction of the case 100.

The module auxiliary chamber 390 may increase an empty space between the module upper face 309 and the charging/discharging module portion 500, thereby improving a flow of air moving toward the module hole 325 along the module upper face 309.

In addition, for a flow of air moving toward the module hole 325 may move toward the module upper face 309 and then move along the module upper face 309, the module fan 360 may be obliquely provided to move toward an upper part of the module chamber 300.

That is, a rotation axis (not shown) of the module fan 360 may be obliquely provided toward the module upper face 309.

In addition, the module hole 325 may be provided on one side of the module auxiliary chamber 390. Preferably, the module fan 360 and the module hole 325 may be positioned in an opposite direction with the charging/discharging module portion 500 interposed therebetween.

Referring to FIG. 3, an example is shown where the module hole 325 is provided on an auxiliary chamber front face 391, which is a front face of the module auxiliary chamber 390. Alternatively, the module hole 325 may be positioned on a side face of the auxiliary chamber, or may be positioned on an upper part of one face of the module chamber 300.

In FIG. 3, a flow of air inside the module chamber 300 is indicated by an arrow. Considering the oblique direction of the module fan 360 and the position of the charging/discharging module portion 500, a part of the air passing through the module fan 360 will pass through the module auxiliary chamber 390 and move toward the module hole 325. A part of the air will be discharged to the outside through the module hole 325, and the rest will be blocked by a side face and move downward. In FIG. 3, it is shown that the air passing through the module fan 360 circulates only inside the module chamber 300. Alternatively, the air passing through the module fan 360 may circulate also inside the case 100.

Figure 4:
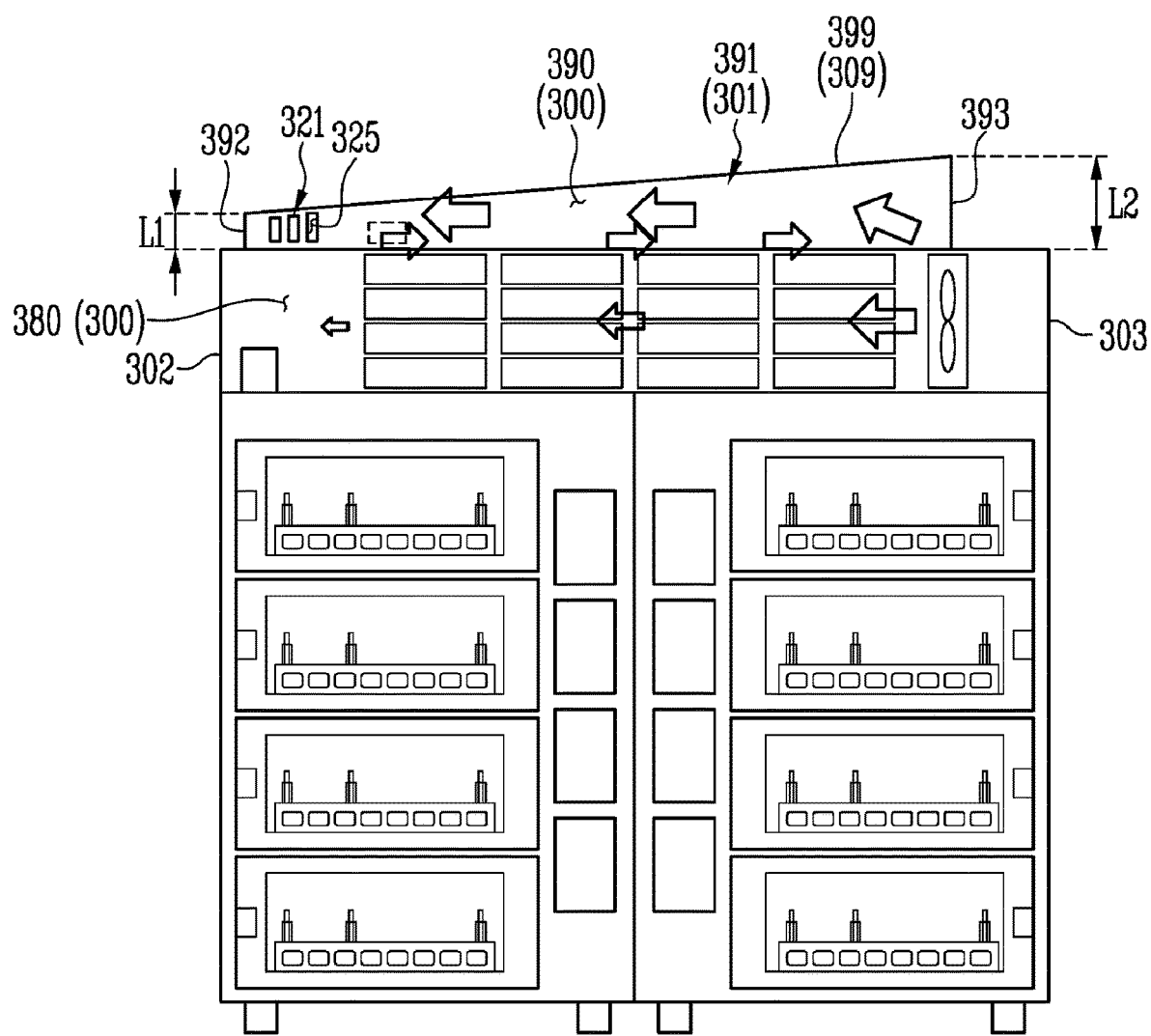
FIG. 4 shows still another example of an apparatus for charging and discharging according to the present disclosure.

FIG. 4 shows still another example of an apparatus for charging and discharging 1000 according to the present disclosure. The apparatus for charging and discharging 1000 may be provided so that the module upper face 309 is oblique. When the module upper face 309 is provided in parallel with the width direction of the case as shown in FIG. 3, the flow speed of the air passing through the module fan 360 may decrease away from the module fan 360. To solve this problem, the cross-section of the module auxiliary chamber 390, which plays the role of a passage through which air passing through the module fan 360 moves, was reduced. In other words, since the flow speed of air increases as the cross-sectional area of a passage through which the air passes decreases, to this end, the module upper face 309 may be obliquely provided along the width direction of the case 100.

Specifically, the height of the module first side face 302 may be lower than the height of the module second side face.

Based on the width direction of the case 100, the module auxiliary chamber 390 may form a part of the module first side face 302 among side faces of the module auxiliary chamber 390 or may form a first auxiliary side face 392 positioned closer to the module first side face 302 than to the module second side face 303 and a part of the module second side face 303 among side faces of the module auxiliary chamber 390 or may include a second auxiliary side face 393 positioned closer to the module second side face 303 than to the module first side face 302.

In addition, the module auxiliary chamber 390 may further include an auxiliary chamber upper face 399 that is a part of an upper face of the module chamber 300 and that forms an upper face of the module auxiliary chamber 390.

Referring to FIG. 4, the auxiliary chamber upper face 399 may be obliquely provided. The height L1 of the first auxiliary side face 392 may be smaller than the height L2 of the second auxiliary side face.

Referring to FIG. 4, a part of air passing through the module fan 360 will pass through the module auxiliary chamber 390 and move toward the module hole 325. A part of the air will be discharged to the outside through the module hole 325, and the rest will be blocked by a side face and move downward. In addition, due to the inclination of the module upper face 309 or the auxiliary chamber upper face 399, a flow moving along an upper face of the charging/discharging module portion 500 may also occur.

Figure 5:
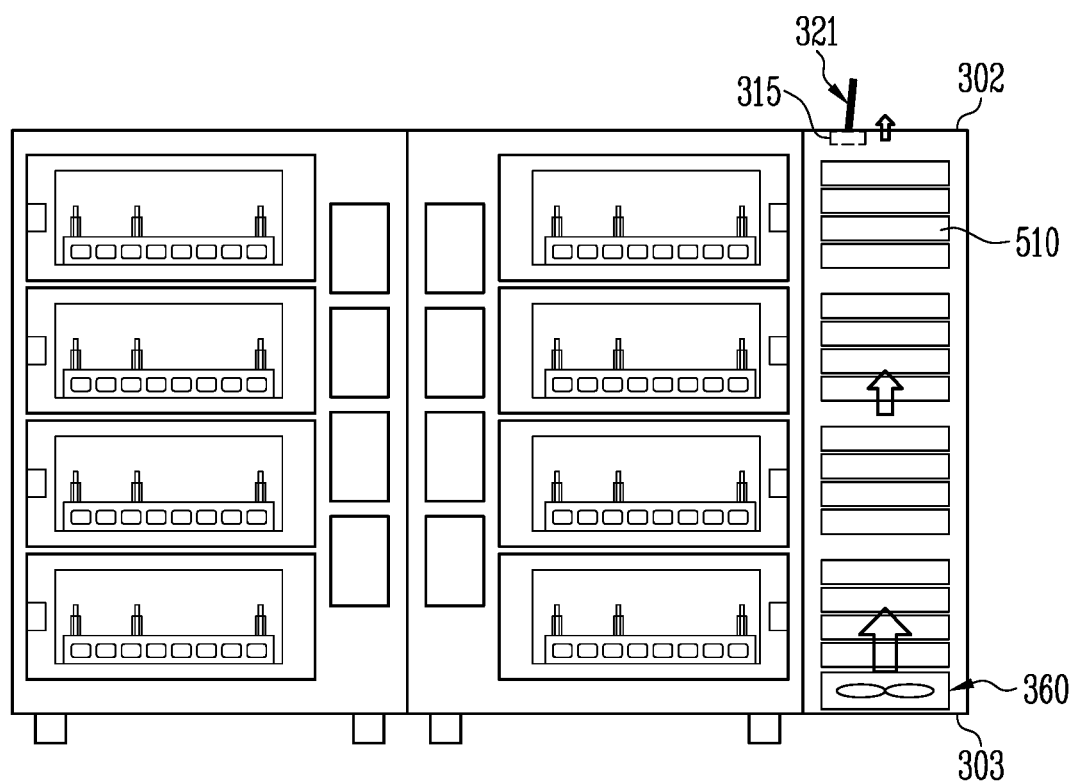
FIG. 5 shows an example in which a charging/discharging module portion is provided along the height direction of a case.
Figure 6:
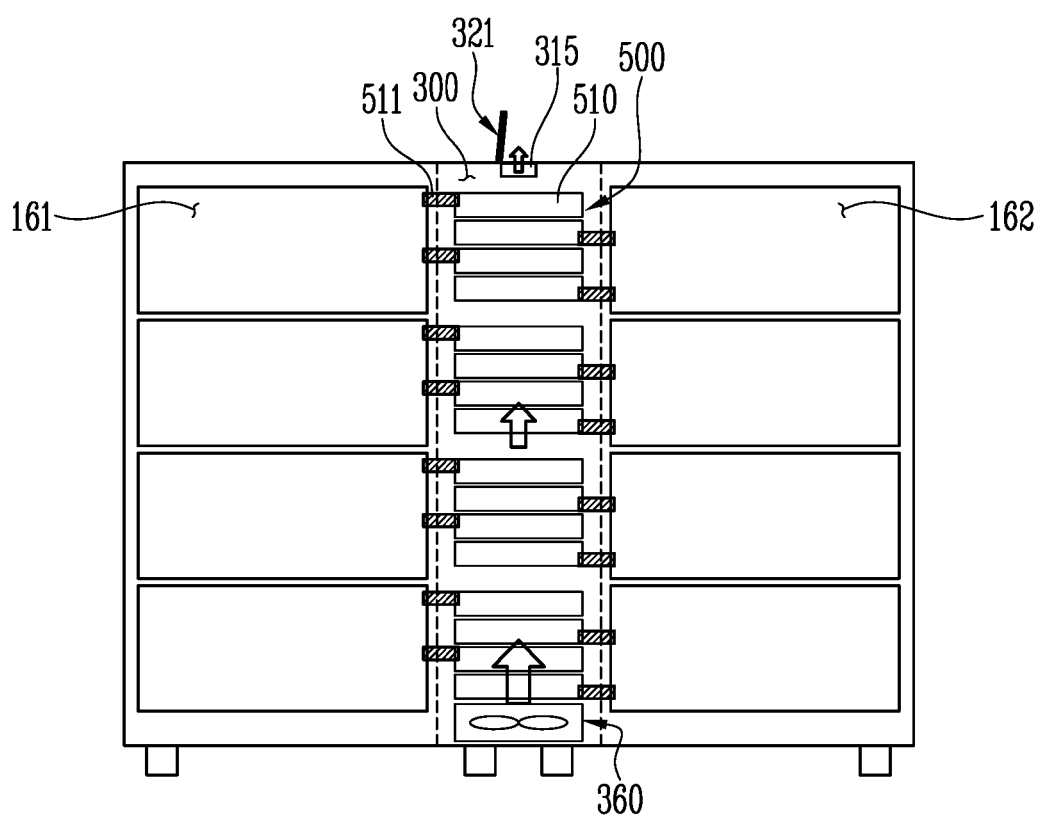
FIG. 6 shows an example in which a charging/discharging module portion is positioned between a first chamber and a second chamber and provided along the height direction of a case.

FIGS. 5 and 6 show an example in which the module chamber 300 is provided in the direction of the height direction of the case 100 rather than the width direction of the case 100. Therefore, FIG. 5 shows an example in which the charging/discharging module portion 500 is provided along the height direction of a case 100. FIG. 6 shows an example in which the charging/discharging module portion 500 is positioned between a first chamber and a second chamber and provided along the height direction of a case 100.

Referring to FIG. 5, the module chamber 300 may be positioned on any one side face of both side faces of a case 100. One side face of the module chamber 300 may form a part of any one side face of a case first side face 102 or a case second side face 103.

Alternatively, the module chamber 300 may be in the form that is separately coupled to an outer face of the case.

Referring to FIG. 5, a module hole 325 and a module fan 360 may be positioned in an opposite direction with the charging/discharging module portion 500 interposed therebetween. Therefore, when the module hole 325 is positioned at a lower part of the charging/discharging module portion 500, the module fan 360 may be positioned at an upper part of the charging/discharging module portion 500. However, in order to discharge the cooled air to the outside through the module hole 325, as shown in FIG. 5, it will preferable that the module hole 325 is positioned at an upper part of the charging/discharging module portion 500, and the module fan 360 is positioned at a lower part of the charging/discharging module portion 500.

Referring to FIG. 5, a plurality of charging/discharging channels 510 included in the charging/discharging module portion 500 may be stacked along the height direction of the case.

When the shape of the charging/discharging channel 510 is assumed to be a hexahedron, the width of the charging/discharging channel 510 may be greater than the height of the charging/discharging channel 510. Therefore, rotating the charging/discharging channel by 90° (degrees) to be upright may be advantageous for air flow using the module fan 360.

Since the charging/discharging module portion 500 is biased toward one side of the case 100, the length of a busbar connecting the charging/discharging channel to a jig of each chamber may longer or different. This has a problem of not only complicating wiring of a busbar but also increasing heat loss due to heat generation in wires.

To solve this problem, referring to FIG. 6, the module chamber 300 may be positioned between the first chamber 161 and the second chamber 162.

A part of the module chamber 300 may be positioned to overlap along the width direction of the case. That is, the charging/discharging module portion 500 may be positioned at the rear of the first chamber 161 and the second chamber 162, and when the apparatus for charging and discharging 1000 is viewed from the front, it may be positioned between the first chamber 161 and the second chamber 162, specifically between the first chamber second side face 1613 (see FIG. 2B) and the second chamber first side face 1622 (see FIG. 2B).

Due to the position of the module chamber 300, the length from the charging/discharging module portion 500 to the first chamber 161 and to the second chamber 162 may be the same. Therefore, the length of a busbar 511 electrically connecting the charging/discharging module portion 500 to the first chamber 161 and the length of a busbar 511 electrically connecting the charging/discharging module portion 500 to the second chamber 162 are the same.

In addition, a plurality of charging/discharging channels 510 for charging and discharging battery cells accommodated in the first chamber 161 and the second chamber 162 positioned at the same height may be grouped into one charging/discharging module and positioned between the heights of a lower face and an upper face of each of the first chamber 161 and the second chamber. This is to make the length of the bus bar 511 the shortest length, thereby reducing thermal loss and simplifying wiring of busbars.

The present disclosure may be modified and implemented in various forms, and its scope is not limited to the embodiments described above. Therefore, if a modified embodi-

What is claimed is:

1. An apparatus for charging and discharging, comprising:
   a case;
   a first chamber and a second chamber positioned in the case along a width direction of the case and configured to accommodate a first battery cell and a second battery cell respectively;
   a module chamber positioned inside the case and outside the first chamber and the second chamber;
   a charging/discharging module portion positioned in the module chamber and charging and discharging the first battery cell and the second battery cell;
   a module hole formed through one face of the case to communicate the module chamber with the outside of the case; and
   an air treatment portion provided inside the case to supply air to the module chamber at a temperature lower than an external temperature, which is a temperature outside the case.

2. The apparatus for charging and discharging according to claim 1, wherein the flow rate of air supplied to the module chamber through the air treatment portion is greater than the flow rate of air discharged through the module hole.

3. The apparatus for charging and discharging according to claim 1, further comprising:
   a module cover opening and closing the module hole;
   an opening/closing actuation portion opening and closing the module cover; and
   a control portion controlling the charging/discharging module portion, the air treatment portion, and the opening/closing actuation portion,
   wherein the control portions operates the module cover through the opening/closing actuation portion to open the module hole when the external temperature is higher than a preset allowable external temperature.

4. The apparatus for charging and discharging according to claim 3, further comprising a temperature sensor sensing the external temperature.

5. The apparatus for charging and discharging according to claim 3, further comprising: based on the width direction of the case, a module first side face forming one side face of the module chamber, wherein the module first side face is a part of a case first side face that forms one side face of the case;
   a module second side face forming the other side face of the module chamber, wherein the module second side face is a part of a case second side face that forms the other side face of the case; and
   a module fan positioned closer to the module second side face than to the module first side face inside the module chamber and moving air at a temperature lower than the external temperature to the charging/discharging module portion,
   wherein the module hole may be positioned at the module first side face of the module chamber or closer to the module first side face than to the module second side face.

6. The apparatus for charging and discharging according to claim 5, wherein the module hole is positioned closer to an upper part of the module chamber than to a lower part of the module chamber in the module chamber.

7. The apparatus for charging and discharging according to claim 6, wherein the module fan is obliquely provided so that air at a temperature lower than the external temperature moves toward an upper part of the module chamber.

8. The apparatus for charging and discharging according to claim 1, wherein the air treatment portion is provided inside the case and includes a heat exchanger exchanging heat with air inside the case.

9. The apparatus for charging and discharging according to claim 8, further comprising a module fan rotating to direct air passing through the heat exchanger toward the charging/discharging module portion.

10. The apparatus for charging and discharging according to claim 1, further comprising: a case upper face forming an upper face of the case; and
    a module upper face forming an upper face of the module chamber, which is a part of the case upper face,
    wherein on the module upper face, at least a part of the module upper face is recessed in a direction away from the charging/discharging module portion along a height direction of the case to form a module auxiliary chamber.

11. The apparatus for charging and discharging according to claim 1, further comprising: a case upper face forming an upper face of the case; and
    a module upper face forming an upper face of the module chamber, which is a part of the case upper face,
    wherein the module upper face is obliquely provided along the width direction of the case.

12. The apparatus for charging and discharging according to claim 11, further comprising: based on the width direction of the case, a module first side face forming one side face of the module chamber, wherein the module first side face is a part of a case first side face that forms one side face of the case; and
    a module second side face forming the other side face of the module chamber, wherein the module second side face is a part of a case second side face that forms the other side face of the case,
    wherein a height of the module first side face is lower than a height of the module second side face.

13. The apparatus for charging and discharging according to claim 12, further comprising a module fan positioned closer to the module first side face than to the module second side face inside the module chamber and moving air at a temperature lower than the external temperature to the charging/discharging module portion.

14. The apparatus for charging and discharging according to claim 13, wherein module hole is positioned at the module first side face of the module chamber or closer to the module first side face than to the module second side face.

15. The apparatus for charging and discharging according to claim 1, wherein at least a part of the module chamber is positioned behind the first chamber and the second chamber based on the front-to-back direction of the case.

16. The apparatus for charging and discharging according to claim 1, wherein the module chamber is positioned close to one side face of both side faces of the case along the width direction of the case and extend along a height direction of the case.

17. The apparatus for charging and discharging according to claim 1, wherein the module chamber is positioned between the first chamber and the second chamber based on the width direction of the case and extend along a height direction of the case.

18. The apparatus for charging and discharging according to claim 17, wherein the charging/discharging module portion includes a plurality of charging/discharging channels stacked along the height direction of the case.

19. The apparatus for charging and discharging according to claim 18, further comprising: a case upper face, which is an upper face of the case; and
    a module chamber upper face forming an upper face of the module chamber, which is a part of the case upper face,
    wherein the module hole is included in the module chamber upper face.

20. The apparatus for charging and discharging according to claim 17, further comprising: based on the width direction of the case, a case first side face and a second side face each forming of both sides of the case,
    wherein the first chamber is positioned closer to the case first side face than to the case second side face, and
    the second chamber is positioned closer to the case second side face than to the case first side face.

* * * * *